(12) United States Patent
Sun et al.

(10) Patent No.: US 12,405,647 B2
(45) Date of Patent: Sep. 2, 2025

(54) MOBILE TERMINAL AND MIDDLE FRAME ASSEMBLY

(71) Applicant: HUAWEI TECHNOLOGIES CO., LTD., Guangdong (CN)

(72) Inventors: Yongfu Sun, Shenzhen (CN); Jie Yang, Dongguan (CN); Jian Shi, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 469 days.

(21) Appl. No.: 17/951,274

(22) Filed: Sep. 23, 2022

(65) Prior Publication Data

US 2023/0022994 A1 Jan. 26, 2023

Related U.S. Application Data

(63) Continuation of application No. PCT/CN2021/082689, filed on Mar. 24, 2021.

(30) Foreign Application Priority Data

Mar. 24, 2020 (CN) .......................... 202010217496.3
Mar. 24, 2020 (CN) .......................... 202020393505.X

(51) Int. Cl.
*G06F 1/20* (2006.01)
*H01Q 1/02* (2006.01)
*H05K 7/20* (2006.01)

(52) U.S. Cl.
CPC ............... *G06F 1/203* (2013.01); *H01Q 1/02* (2013.01); *H05K 7/20336* (2013.01)

(58) Field of Classification Search
CPC ............. H05K 7/2039; H05K 7/20518; H05K 7/20309; H05K 7/2033; G06F 1/203; H01Q 1/02
See application file for complete search history.

(56) References Cited

U.S. PATENT DOCUMENTS 9,013,874 B2 * 4/2015 Kaldani .................. F28F 3/048
 361/679.52
9,625,215 B2 * 4/2017 Hsiao ...................... G06F 1/203
(Continued)

FOREIGN PATENT DOCUMENTS

CN 104039115 B 9/2016
CN 106304817 A 1/2017
(Continued)

OTHER PUBLICATIONS

CN-108513515-A Translation (Year: 2018).*
(Continued)

*Primary Examiner* — Jayprakash N Gandhi
*Assistant Examiner* — Matthew Sinclair Muir

(57) ABSTRACT

A mobile terminal includes middle frame assembly that is configured to bear an electronic component in the mobile terminal. The electronic component includes a heat source, and the middle frame assembly includes a middle frame, one or more heat pipes, and a first vapor chamber. The middle frame includes a heat dissipation region corresponding to the heat source. The first vapor chamber is accommodated in the heat dissipation region. The heat pipes are connected to the first vapor chamber, and are configured to dissipate heat from the first vapor chamber. This structure of the mobile terminal and the middle frame assembly of the mobile terminal improves heat dissipation performance of the mobile terminal.

25 Claims, 10 Drawing Sheets

(56) References Cited

U.S. PATENT DOCUMENTS

| | | | |
|---|---|---|---|
| 10,605,538 B2* | 3/2020 | Ahamed | F28D 15/046 |
| 2012/0132402 A1* | 5/2012 | Aoki | F28D 15/06 |
| | | | 165/104.21 |
| 2013/0198501 A1* | 8/2013 | Wu | H01L 23/427 |
| | | | 713/2 |
| 2014/0321058 A1* | 10/2014 | Fujieda | F28D 15/0233 |
| | | | 29/890.032 |
| 2015/0253823 A1 | 9/2015 | Han | |
| 2017/0235349 A1 | 8/2017 | Ghioni et al. | |
| 2017/0292793 A1* | 10/2017 | Sun | F28F 9/001 |
| 2018/0142961 A1* | 5/2018 | Wu | F28D 15/0266 |
| 2018/0373299 A1 | 12/2018 | Wang et al. | |
| 2020/0323103 A1* | 10/2020 | Lee | F28D 15/046 |
| 2022/0087067 A1* | 3/2022 | Jia | H05K 5/0086 |

FOREIGN PATENT DOCUMENTS

| | | | | |
|---|---|---|---|---|
| CN | 106993393 A | 7/2017 | | |
| CN | 206441100 U | 8/2017 | | |
| CN | 104488371 B | 11/2017 | | |
| CN | 108513515 A | * 9/2018 | ......... | H05K 7/20336 |
| CN | 108601293 A | 9/2018 | | |
| CN | 108617159 A | 10/2018 | | |
| CN | 108650866 A | 10/2018 | | |
| CN | 209358916 U | 9/2019 | | |
| CN | 209563090 U | 10/2019 | | |
| CN | 110794641 A | 2/2020 | | |
| CN | 210183768 U | 3/2020 | | |
| CN | 212164015 U | 12/2020 | | |
| KR | 102077002 B1 | 2/2020 | | |
| WO | 2019103327 A1 | 5/2019 | | |

OTHER PUBLICATIONS

Extended European Search Report dated Jul. 11, 2023 issued for European Application No. 21774280.8 (11 pages).
International Search Report dated May 11, 2021 issued for International Application No. PCT/CN2021/082689 (10 pages).

* cited by examiner

MOBILE TERMINAL AND MIDDLE FRAME ASSEMBLY

CROSS-REFERENCE TO RELATED APPLICATIONS

This application is a continuation of International Application No. PCT/CN2021/082689, filed on Mar. 24, 2021, which claims priority to Chinese Patent Application No. 202010217496.3, filed on Mar. 24, 2020 and Chinese Patent Application No. 202020393505.X, filed on Mar. 24, 2020. The disclosures of the aforementioned applications are hereby incorporated by reference in their entireties.

TECHNICAL FIELD

This disclosure relates to the field of terminal technologies, and in particular, to a mobile terminal and a middle frame assembly.

BACKGROUND

Heat is separately dissipated from all existing mobile terminals by using a single heat plate or a single heat pipe. However, as the mobile terminal becomes intelligent at an increasingly high degree, more heat is generated in a main frequency upgrade of the mobile terminal. If excessive heat cannot be rapidly dissipated, not only a service life of the mobile terminal is affected, but also intuitive experience of a consumer is affected.

SUMMARY

Embodiments of this disclosure provide a terminal and a middle frame assembly thereof, to improve heat dissipation performance of a mobile terminal.

According to a first aspect, the present invention provides a middle frame assembly, configured to bear an electronic component in a mobile terminal. The electronic component includes a heat source, and the middle frame assembly includes a middle frame, one or more heat pipes, and a first vapor chamber. The middle frame includes a heat dissipation region corresponding to the heat source, and the first vapor chamber is accommodated in the heat dissipation region. The first vapor chamber may be further fixedly connected to the middle frame by using the heat dissipation region, and a specific fastening manner is not limited to the following several manners: The first vapor chamber may be fastened to the middle frame through bottom welding, may be fastened to the middle frame through side welding, may be fastened to the middle frame through bottom bonding, may be fixedly connected to the middle frame by using circumferential overlapping structures, or may be connected to the middle frame through combination of bottom surface fastening and circumferential fastening. Each heat pipe is connected to the first vapor chamber (a manner of connecting the heat pipe and the first vapor chamber is not limited to fastening through overlapping and welding, sealing through welding after the heat pipe and the first vapor chamber are connected, or the like), and is configured to dissipate heat from the first vapor chamber. In this disclosure, one end of the heat pipe is connected to the first vapor chamber, and heat of the heat source may be rapidly dissipated by using a comprehensive heat conduction effect of two-dimensional extended heat conduction of the first vapor chamber and one-dimensional linear heat conduction of the heat pipe, to prolong a service life of the heat source, thereby prolonging a service life of the mobile terminal and improving use experience of a consumer.

In a possible implementation, at least one of the one or more heat pipes is further connected to a part that is in the middle frame and whose temperature is lower than a temperature of the first vapor chamber. The part that is in the middle frame and whose temperature is lower than the temperature of the first vapor chamber may be a region at an edge of the middle frame, such as edges on two sides of the middle frame or an edge at the bottom of the middle frame. In this way, when the mobile terminal runs normally, because the first vapor chamber is fastened to the middle frame, heat may be transferred to the first vapor chamber and transferred to the heat pipe, the heat transferred to the heat pipe may be transferred to the entire middle frame, heat of the heat source may be conducted to the entire middle frame, and the heat is conducted out by using the middle frame. An area of the middle frame is large, and heat dissipation efficiency is high, thereby improving heat dissipation performance of the entire mobile terminal.

In a possible implementation, at least one of the one or more heat pipes is connected to the middle frame by using a heat conducting medium. The heat conducting medium may be a heat conducting adhesive or a graphite material. Heat conductivity of the heat conducting adhesive is twice over heat conductivity of an ordinary adhesive layer. The heat conducting adhesive has good heat conduction performance, and can rapidly transfer heat on the heat pipe to the entire middle frame, so that heat dissipation efficiency is high.

In a possible implementation, internal space of at least one of the one or more heat pipes is connected to internal space of the first vapor chamber to form a heat conducting cavity. A relatively large and complete heat conducting cavity is formed inside after the heat pipe and the first vapor chamber are connected. Working fluid in the heat conducting cavity passes through a longer path and takes longer time to complete one time of heat conduction circulation, so that heat of the heat source may be transferred to a larger region of the middle frame, and the heat is conducted out more dispersedly, and therefore heat dissipation efficiency is high.

In a possible implementation, at least one of the one or more heat pipes is inserted into the first vapor chamber. In this manner, the heat pipe overlaps the first vapor chamber inside the first vapor chamber. Connectivity between the heat pipe and the first vapor chamber is better.

In a possible implementation, the electronic component further includes a battery spaced from the heat source, and the middle frame further includes a battery placement region corresponding to the battery. The battery placement region includes a first edge and a second edge that are disposed opposite to each other, the heat dissipation region is adjacent to the first edge, and at least one of the one or more heat pipes extends from the heat dissipation region to a direction of the second edge. In this way, the heat pipe may extend in a larger range of the middle frame, to transfer heat of the heat source to a further distance, so that a heat dissipation effect is fairly good.

In a possible implementation, at least one of the one or more heat pipes is not in contact with the battery. Therefore, when the mobile terminal runs normally, the mobile terminal generates heat, and a temperature of a part that is in the middle frame and that is connected to the heat pipe is less than that of the first vapor chamber. When the heat pipe is not in contact with the battery, the heat pipe and the battery do not transfer heat to each other, and the heat pipe and the battery are not interfered with each other. In addition, the heat pipe is disposed avoiding the battery, and space for placing the heat pipe does not need to be disposed on a surface of the battery, which facilitates a thin-type design of the mobile terminal.

In a possible implementation, the one or more heat pipes include a first heat pipe and a second heat pipe that are disposed at intervals, the first heat pipe surrounds the battery placement region, and the second heat pipe is disposed overlapping the battery placement region. In this implementation, the heat pipe is disposed in both the battery placement region and a periphery of the battery placement region, to enhance heat dissipation performance.

In a possible implementation, the middle frame includes a top, a bottom disposed opposite to the top, and two sidewalls located between the top and the bottom. The heat dissipation region is located between the first edge of the battery placement region and the top, and another element placement region is disposed between the second edge of the battery placement region and the bottom. The middle frame further includes a second vapor chamber, the second vapor chamber is fastened in the another element placement region, and at least one of the one or more heat pipes is further connected to the second vapor chamber. When the heat source is fixedly placed in the heat dissipation region and another heat source is fixedly placed in the another element placement region, heat of the heat source may be conducted to the first vapor chamber and conducted to the heat pipe, and heat of the another heat source may be conducted to the second vapor chamber and conducted to the heat pipe. Further, the heat of the heat source and the another heat source may be rapidly dissipated under comprehensive action of the first vapor chamber, the second vapor chamber, and the heat pipe, to prolong a service life of the heat source and that of the another heat source, thereby prolonging a service life of the mobile terminal and improving use experience of a consumer. In addition, because the first vapor chamber and the second vapor chamber are fastened to the middle frame, the heat of the heat source and the another heat source may be conducted to the entire middle frame, and the heat is conducted out by using the middle frame, thereby implementing heat dissipation performance of the entire middle frame. An area of the middle frame is large, and heat dissipation efficiency is high, thereby improving heat dissipation performance of the entire mobile terminal.

In a possible implementation, one end of at least one of the one or more heat pipes overlaps the first vapor chamber, and the other end of the at least one of the one or more heat pipes overlaps the second vapor chamber. This implementation provides a manner of connecting the heat pipe to the first vapor chamber and the second vapor chamber. Overlapping means that in a direction perpendicular to the first vapor chamber and the second vapor chamber, there is a region in which the heat pipe partially overlaps the first and second vapor chambers. This connection structure is stable and has good reliability.

In a possible implementation, at least one of the one or more heat pipes extends along the periphery of the battery placement region, and at least a part of the heat pipe is located in a gap between the battery placement region and a sidewall of the middle frame. The gap between the battery placement region and the sidewall of the middle frame is idle space. In this disclosure, at least a part of the heat pipe is accommodated in the gap between the battery placement region and the sidewall of the middle frame, that is, a part of the heat pipe is accommodated in the idle space. In this way, not only the idle space is used, but also no new space needs to be disposed in the mobile terminal to accommodate the heat pipe, so that a volume of the mobile terminal is not increased.

In a possible implementation, at least one of the one or more heat pipes is in contact with the surface of the battery. Therefore, heat on the battery may be further transferred to the heat pipe and is then transferred to the entire middle frame, so that the middle frame dissipates the heat from the battery, and a heat dissipation area is large, and a heat dissipation effect is fairly good.

In a possible implementation, the one or more heat pipes include at least a first heat pipe and a second heat pipe that are disposed at intervals, and both the first heat pipe and the second heat pipe are disposed around the battery placement region. In addition, when both the first heat pipe and the second heat pipe are disposed around the battery placement region, space between the battery placement region and the sidewall is used, and neither of the two heat pipes overlaps the battery placement region and affects a thickness of the middle frame. When the battery is placed in the mobile terminal, the heat pipe does not overlap the battery, and does not affect the thickness of the mobile terminal.

In a possible implementation, at least one of the one or more heat pipes includes at least a first heat pipe and a second heat pipe that are disposed at intervals, the first heat pipe surrounds the battery placement region, and the second heat pipe overlaps the battery placement region. In this way, heat dissipation effects of the two heat pipes can be used, a region that is in the middle frame and that can be used for heat dissipation is larger, and a heat dissipation effect is better, so that heat of the heat source can be dissipated more rapidly, to prolong a service life of the heat source, thereby prolonging a service life of the mobile terminal and improving use experience of a consumer. In addition, space between the battery placement region and the sidewall of the middle frame and other space can be effectively used. In addition, the manner in which the second heat pipe overlaps the battery placement region facilitates installation of the second heat pipe and is convenient for operation, and the second heat pipe may be configured to dissipate heat of the battery.

In a possible implementation, the middle frame is provided with a first removed region and a third removed region, and the third removed region is formed at the bottom of the first removed region. The first vapor chamber is embedded in the first removed region, at least one of the one or more heat pipes is partially embedded in the third removed region, and a part of the at least one of the one or more heat pipes in the third removed region is stacked with the first vapor chamber. The first removed region is a groove or a hole, and the second removed region is a groove or a hole. In this implementation, a part of the heat pipe is located between the first vapor chamber and the heating source. When the first removed region and the second removed region have groove structures, openings of the first removed region and the second removed region face a side that is of the middle frame and that is away from the heating source. The heating source is spaced from the heat pipe and the first vapor chamber by the middle frame, and the middle frame is configured to support the heating source.

In a possible implementation, the middle frame is provided with a first removed region, a second removed region, and a third removed region. The first vapor chamber is embedded in the first removed region, the second vapor chamber is embedded in the second removed region, and at least one of the one or more heat pipes is embedded in the third removed region. The first removed region is a groove or a hole, the second removed region is a groove or a hole, and the third removed region is a groove or a hole. In this manner, the vapor chamber and the heat pipe are embedded in the removed regions, so that the first vapor chamber, the second vapor chamber, and the heat pipe do not increase a thickness of the middle frame, and the mobile terminal may be relatively thin. It may be understood that the first removed region, the second removed region, and the third removed region may be simultaneously disposed in one implementation. In another implementation, one or two of the three removed regions may be selectively configured based on a specific structure in the mobile terminal. For example, in some places, a gap exists between electronic components and can be used for placing the heat pipe. In this case, the third removed region does not need to be disposed. This architecture facilitates a thin-type design of the entire mobile terminal, and can reduce a weight of the mobile terminal.

In a possible implementation, that at least one of the one or more heat pipes is connected to the first vapor chamber means that internal space of the heat pipe and that of the first vapor chamber are interconnected to form a relatively large heat conducting cavity. A relatively large and complete heat conducting cavity is formed inside after the heat pipe and the first vapor chamber are connected. Working fluid in the heat conducting cavity passes through a longer path and takes longer time to complete one time of heat conduction circulation, so that heat of the heat source may be transferred to a larger region of the middle frame, and the heat is conducted out more dispersedly, and therefore heat dissipation efficiency is high. The heat pipe and the second vapor chamber may also be disposed to form a connection architecture.

In a possible implementation, a thickness of the first vapor chamber is increased step by step, and/or a thickness of the second vapor chamber is increased step by step, to correspondingly adapt to an electronic component whose height is decreased step by step.

In a possible implementation, quantities of heat pipes, first vapor chambers, and second vapor chambers are not limited to one, and there may be two or more heat pipes, first vapor chambers, and second vapor chambers, which may be configured based on a specific heat dissipation requirement in the mobile terminal.

In a possible implementation, a heat conducting film is disposed on an outer surface of any one or more of at least of the one or more heat pipes, the first vapor chamber, and the second vapor chamber. The heat conducting film is disposed, so that heat on the heat pipe and the vapor chamber is conducted to the outside more rapidly.

In a possible implementation, the middle frame is provided with a groove, the first vapor chamber is accommodated in the groove, and the first vapor chamber is fastened to a bottom of the groove by using a heat conducting adhesive. In a specific implementation, the middle frame includes a first overlapping side extending toward the inside of the groove, the first vapor chamber includes a third overlapping side, and the first overlapping side is fastened to the third overlapping side.

It may be understood that the middle frame may further include a second overlapping side configured to fasten the second vapor chamber. The first vapor chamber includes the third overlapping side, and the first overlapping side overlaps the third overlapping side, so that the first vapor chamber is fastened in the heat dissipation region. The first overlapping side and the third overlapping side may be fastened through welding. Similarly, the second vapor chamber may include a fourth overlapping side, and the second overlapping side overlaps the fourth overlapping side, so that the second vapor chamber is fastened in the another element placement region. This fastening manner is not only easy to implement, but also has a good fastening effect.

Specifically, in an implementation, in the solution in which the first vapor chamber is fixedly connected to the middle frame by using an overlapping side, the groove provided on the middle frame may be a hole. When the groove is a hole, the middle frame has no part used to bear the first vapor chamber, but the first vapor chamber may be connected to the middle frame by using an overlapping side.

In another implementation, a first groove provided on the middle frame may be a blind hole, that is, the first groove is not a hole. In this way, a partial structure, which may be referred to as a bearing part, exists in the middle frame, and may be used to bear the first vapor chamber. The first vapor chamber is fastened to the bearing part of the middle frame by using a heat conducting adhesive. In this implementation, to reduce a thickness of the heat conducting adhesive, after the thickness of the heat conducting adhesive becomes smaller, strength of connection between the first vapor chamber and the middle frame becomes insufficient. To protect connection strength and reliability, an overlapping structure may also be disposed, that is, the first overlapping side on the middle frame cooperates with the third overlapping side on the first vapor chamber to enhance reliability of connection between the first vapor chamber and the middle frame. In this implementation, the first vapor chamber and the middle frame are fastened through cooperation of the heat conducting adhesive and the overlapping structure.

In a possible implementation, at least one of the one or more heat pipes extends between electronic components, and/or at least one of the one or more heat pipes extends between the electronic component and a boundary of the middle frame. In this way, not only a gap between the electronic components and a gap between the electronic component and the boundary of the middle frame can be used to accommodate the heat pipe, but also no new space needs to be added to accommodate the heat pipe, so that a thickness of the mobile terminal does not need to be increased.

This disclosure provides a mobile terminal, including a main board and the foregoing middle frame. The main board includes the electronic component, the main board is installed in the middle frame, and the heat source of the main board is disposed in a heat dissipation region of the middle frame. Heat on the mobile terminal may be rapidly dissipated, thereby prolonging a service life of the mobile terminal and improving use experience of a consumer. In addition, because the first vapor chamber is fastened to the middle frame, heat of the heat source may be conducted to the entire middle frame, and the heat is conducted out by using the middle frame, thereby implementing heat dissipation performance of the entire middle frame. An area of the middle frame is large, and heat dissipation efficiency is high, thereby improving heat dissipation performance of the entire mobile terminal.

In a possible implementation, the mobile terminal further includes a screen, a main board, a battery, and a battery cover, and the middle frame further includes a battery placement region corresponding to the battery. The battery placement region is disposed on one side of the heat dissipation region, the screen and the main board are respectively installed on two opposite sides of the middle frame, the heat source of the main board is disposed in the heat dissipation region of the middle frame, the battery is electrically connected to the main board, the battery is located on a side that is of the main board and that is away from the middle frame, and the battery is located in the battery placement region. The battery cover is installed on the middle frame, and the battery cover fastens the main board and the battery in the middle frame.

In a possible implementation, a wire groove is disposed on an outer surface of the heat pipe, the wire groove is configured to fasten an internal conducting wire of the mobile terminal, and the conducting wire is configured to electrically connect electronic components in the mobile terminal. For example, the conducting wire is configured to electrically connect an electronic component in the heat dissipation region and an electronic component in the another element placement region. The wire groove on the surface of the heat pipe may be used as a carrier of the conducting wire, so that the conducting wire may be fastened in the wire groove of the heat pipe, to fasten a location of the conducting wire, thereby avoiding damage caused to the conducting wire due to shaking, and prolonging a service life of the mobile terminal.

According to a second aspect, this disclosure further provides a mobile terminal, including a main board and the middle frame assembly according to any of the possible implementations. The heat source is disposed on the main board, and the main board is installed in the middle frame.

According to a third aspect, this disclosure further provides a heat dissipation assembly, including at least one vapor chamber and at least one heat pipe in the first aspect and the implementations of the first aspect. For a manner of connecting the at least one vapor chamber and the at least one heat pipe, refer to the foregoing aspect and the implementation. Details are not described herein again. As described in the foregoing aspect, the heat dissipation assembly provided in this aspect may cooperate with a middle frame in a mobile terminal to implement better heat dissipation. In another implementation, the heat dissipation assembly may cooperate with another component in another device to implement better heat dissipation.

In conclusion, in this disclosure, one end of the heat pipe is connected to the first vapor chamber, and heat of the heat source may be rapidly dissipated by using a comprehensive heat conduction effect of two-dimensional extended heat conduction of the vapor chamber and one-dimensional linear heat conduction of the heat pipe, to prolong a service life of the heat source, thereby prolonging a service life of the mobile terminal and improving use experience of a consumer. In addition, because the first vapor chamber is fastened to the middle frame, heat of the heat source may be conducted to the entire middle frame, and the heat is conducted out by using the middle frame, thereby implementing heat dissipation performance of the entire middle frame. An area of the middle frame is large, and heat dissipation efficiency is high, thereby improving heat dissipation performance of the entire mobile terminal.

BRIEF DESCRIPTION OF DRAWINGS

To describe the technical solutions in embodiments of this disclosure or in the background more clearly, the following briefly describes the accompanying drawings for describing embodiments of this disclosure or the background.

DESCRIPTION OF EMBODIMENTS

The following describes embodiments of this disclosure with reference to the accompanying drawings in embodiments of this disclosure.

Figure 1A:
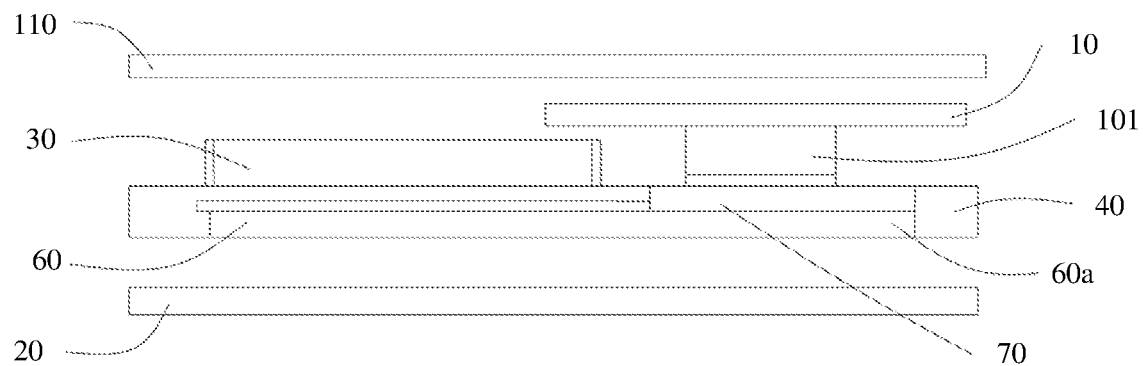
FIG. 1a is a schematic cross-sectional diagram of a mobile terminal according to an embodiment of the present invention.
Figure 1B:
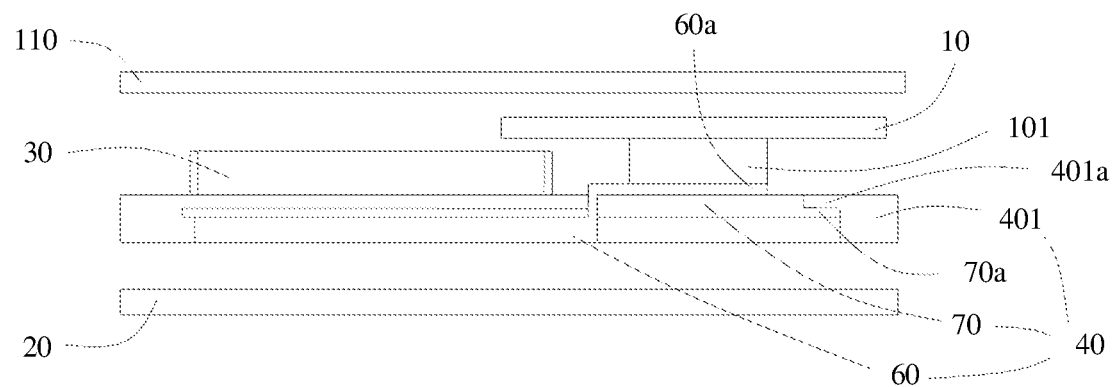
FIG. 1b is another schematic cross-sectional diagram of a mobile terminal according to an embodiment of the present invention.
Figure 2:
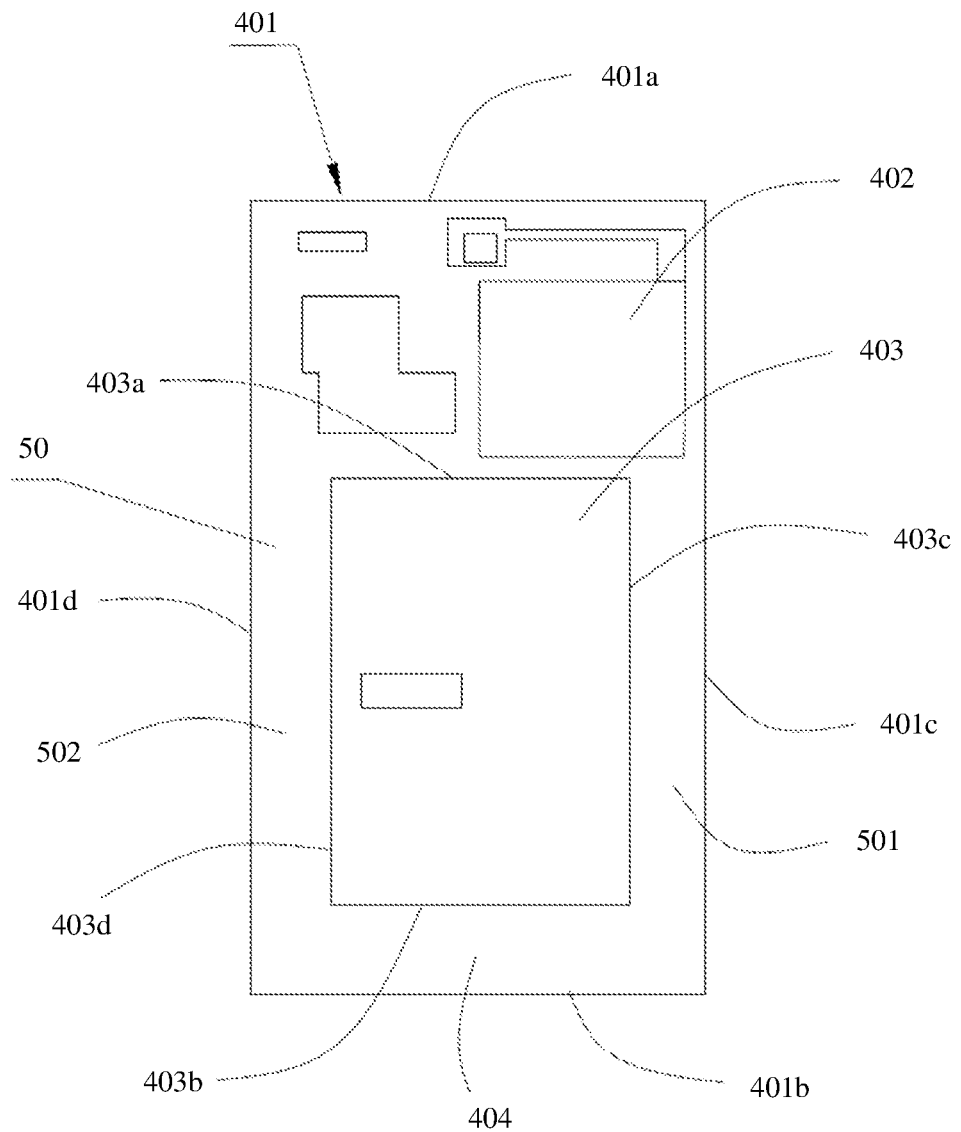
FIG. 2 is a schematic top view of a middle frame in a middle frame assembly according to an embodiment of the present invention.

Refer to FIG. 1a, FIG. 1b, and FIG. 2. FIG. 1a and FIG. 1b are two schematic cross-sectional diagrams of a mobile terminal according to an embodiment of the present invention. The mobile terminal includes but is not limited to devices such as a tablet computer, a mobile phone, a watch, an electronic reader, a remote control, a personal computer (PC), a notebook computer, an in-vehicle device, a network television, and a wearable device. The mobile terminal may include a main board 10, a screen 20, a battery 30, a middle frame assembly 40, and a battery cover 110.

The main board 10 may include a plurality of electronic components. Some electronic components (for example, various processors) generate a relatively large amount of heat during working, and the heat needs to be dissipated from the electronic components (for example, some heat dissipation components are installed). These electronic components are referred to as heat sources in this disclosure.

As shown in FIG. 1b, the middle frame assembly 40 may include a middle frame 401, a heat pipe 60, and a first vapor chamber (VC) 70. The middle frame 401 is an internal bracket of a device and may be configured to bear the screen 20, the main board 10, and another electronic component. The screen 20 and the main board 10 are respectively installed on two opposite sides of the middle frame 401. The battery 30 and the main board 10 are located on a same side of the middle frame 401. The battery 30 is electrically connected to the main board 10. The battery cover 110 and the middle frame 401 form an accommodation space. The main board 10, the battery 30, and another electronic component are accommodated in the accommodation space. The another electronic component may be a camera, a key, a speaker, or the like. A material of the middle frame 401 may be a metal material having specific hardness, such as aluminum alloy.

In this disclosure, the heat pipe 60 and the first vapor chamber 70 are integrated on the middle frame 401 to form the middle frame assembly 40, to improve heat dissipation performance of the mobile terminal. The vapor chamber and the heat pipe each have a vacuum heat conducting cavity. An inner wall of the heat conducting cavity has a capillary structure, and working fluid is injected, where the working fluid may be pure water. Working principles of two-phase heat dissipation parts such as the VC and the heat pipe are similar, and include four main steps: conduction, evaporation, convection, and coagulation. The vapor chamber is used as an example to provide the following description. Heat generated by a heat source enters the vapor chamber through heat conduction, and working fluid near the heat source absorbs the heat and then rapidly vaporizes the heat while taking away a large amount of heat. Then, with a latent heat property of the vapor, when the vapor in the chamber is diffused from a high-pressure region (namely, a high-temperature region) to a low-pressure region (namely, a low-temperature region), and the vapor is in contact with the inner wall with a relatively low temperature, the vapor rapidly condenses into a liquid state and releases heat. The working fluid condensed into the liquid state returns to the heat source under action of capillary force of the capillary structure, to complete one time of heat conduction circulation, and form a two-way circulation system in which the working fluid has both a vapor phase and a liquid phase. An area of the vapor chamber is larger than that of the heat pipe, so that two-dimensional extended heat conduction can be implemented. A width of the heat pipe is relatively small, and one-dimensional linear heat conduction can be performed. Specifically, one-dimensional heat conduction is performed along an extension direction of the heat pipe. A material of the heat pipe is usually a metal material, such as aluminum or copper. A material of the vapor chamber is also usually metal, for example, copper may be selected.

In this disclosure, the heat pipe 60 and the vapor chamber (such as the first vapor chamber 70) may have a same physical property parameter, or may be different in at least one physical property parameter, for example, different housing material combinations, different internal working fluid materials, different capillary structures (cross-sectional areas of capillary layers), or the like; or one or more of an amount of working fluid (namely, an amount of filled working fluid), a type of working fluid, and a pipe material (which may be copper or aluminum) and a thickness that are of the heat pipe 60.

FIG. 2 is a schematic top view of a structure of the middle frame 401 according to an embodiment of this disclosure. The middle frame 401 includes a top 401a, a bottom 401b disposed opposite to the top 401a, and two sidewalls 401c and 401d that are disposed opposite to each other between the top 401a and the bottom 401b. The top 401a, the bottom 401b, and the two sidewalls 401c and 401d described herein refer to four sides on a periphery of the middle frame (which are four sides in the schematic diagram shown in FIG. 2, and are actually four outer surfaces of the middle frame from a three-dimensional perspective, where the four surfaces are surfaces of a bezel connected between a screen and a rear cover of the mobile terminal). For example, the mobile terminal is a mobile phone. The middle frame is basically rectangular, and the two sidewalls 401c and 401d are long sides of the middle frame. The middle frame 401 may include a heat dissipation region 402 corresponding to a heat source 101, a battery placement region 403 corresponding to the battery 30, and another element placement region 404. The heat dissipation region 402 is located between the battery placement region 403 and the top 401a, and the another element placement region 404 is located between the battery placement region 403 and the bottom 401b. In another implementation, the heat dissipation region 402 may be located between the battery placement region 403 and one sidewall.

The heat dissipation region 402 is used to provide partial space to install one or more heat dissipation components (such as the VC or the heat pipe) to dissipate heat from the heat source. For example, the heat dissipation region 402 may be a removed region on the middle frame 401, that is, a region in which a part of the middle frame material is removed. Specifically, a part of the middle frame material may be removed to form a "groove", or all of the middle frame material may be removed to form a "hole". Certainly, in some other embodiments, a material in the heat dissipation region 402 may not be removed. To implement a thin-type design of the mobile terminal, a hole may be dug on the middle frame 401, and a region in which the hole is dug may be used to accommodate a heat source (such as a processor) on the main board, and then a VC is installed on the heat source to dissipate heat from the heat source. The heat dissipation region 402 may be a solid region on the middle frame 401, and a hole is not dug. However, a groove may be dug to accommodate the heat source or the VC (for example, a groove is dug on both a front surface and a back surface to accommodate both the VC and the heat source, or a groove is dug on one surface to accommodate the VC or the heat source). In another embodiment, neither a hole nor a groove is dug, or both a hole and a groove may be dug (both a groove and a hole may be provided in one region, or a groove and a hole are disposed at intervals). Similarly, the battery placement region 403 and the another element placement region 404 may be hollow regions or solid regions on the middle frame 401 or a combination of the two regions. The "groove" in this disclosure refers to a concave structure that does not penetrate the middle frame, and a shape is not limited (for example, may be a rectangle, a square, a circle, or various irregular shapes). The "hole" (which may also be understood as a "hole" or an "opening") in this disclosure is a structure formed by penetrating the middle frame, and a shape is also not limited.

The battery placement region 403 includes a first edge 403a, a second edge 403b, a third edge 403c, and a fourth edge 403d. The heat dissipation region 402 is located between the first edge 403a of the battery placement region 403 and the top 401a. The another element placement region 404 is disposed between the second edge 403b of the battery placement region 403 and the bottom 401b, and a gap 50 is disposed between the battery placement region 403 and the sidewall 401c of the middle frame 401. Generally, no electronic component is disposed at a location between the battery placement region 403 and the sidewall 401c of the middle frame 401. In this disclosure, the heat pipe 60 is disposed at a location of the gap 50, so that heat dissipation performance can be improved.

Specifically, a first gap 501 is disposed between the third edge 403c and the first sidewall 401c, and a second gap 502 is disposed between the fourth edge 403d and the second sidewall 401d. The middle frame 401 at locations of the first gap 501 and the second gap 502 may be provided with a groove or a hole. The hole refers to a through-hole shape dug on the middle frame through excavation. The groove and the hole may be disposed to implement a thin-type design of the mobile terminal or reduce a weight of the middle frame 401. However, to ensure rigidity of the middle frame 401, the groove or the hole may be disposed at a proper location, and a thickness may be reserved at a proper location to ensure overall rigidity of the middle frame 401, so that the middle frame 401 is not easily deformed and can bear an electronic component.

Figure 3:
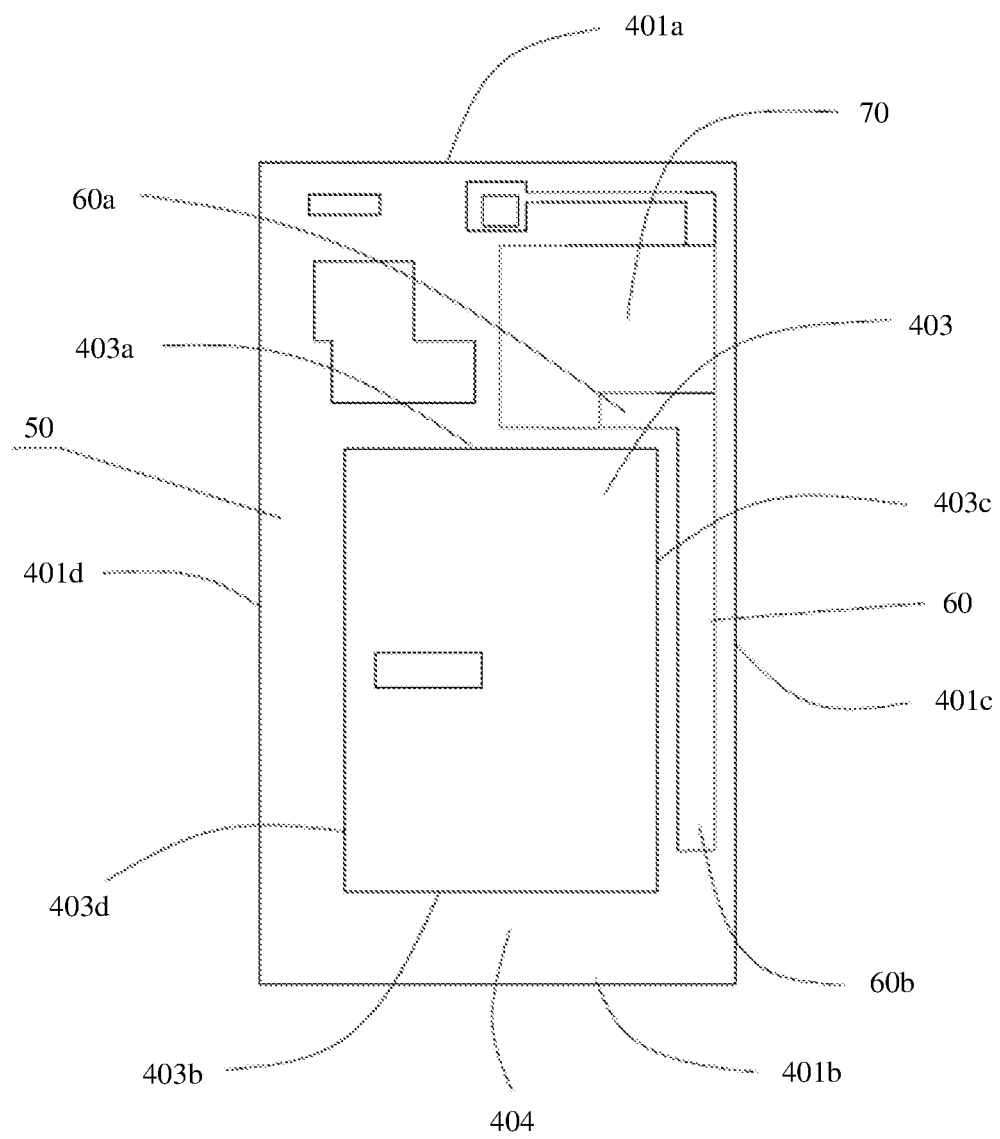
FIG. 3 is a schematic top view of a first structure of a middle frame assembly according to an embodiment of the present invention.

FIG. 3 is a schematic top view of a structure of the middle frame assembly 40. The first vapor chamber 70 is accommodated in the heat dissipation region 402. Specifically, the first vapor chamber 70 may be fixedly connected to the middle frame 401 in the heat dissipation region 402. A specific fastening manner is not limited to the following several manners: The first vapor chamber 70 may be fastened to the middle frame 401 through bottom welding, may be fastened to the middle frame 401 through side welding, may be fastened to the middle frame 401 through bottom bonding, may be fixedly connected to the middle frame 401 by using circumferential overlapping structures, or may be connected to the middle frame 401 through combination of bottom surface fastening and circumferential fastening. The heat pipe 60 is connected to the first vapor chamber 70 and is configured to dissipate heat from the first vapor chamber 70. A manner of connecting the heat pipe 60 and the first vapor chamber 70 is not limited to fastening through overlapping and welding, sealing through welding after the heat pipe 60 and the first vapor chamber 70 are connected, or the like. A thickness of the first vapor chamber 70 may be less than or equal to 0.8 mm, and a nominal pipe diameter of the heat pipe 60 may be less than or equal to 8 mm. To make the mobile terminal thinner, a thickness of the heat pipe 60 may be less than or equal to 0.6 mm. A small-sized heat pipe 60 may extend between electronic components or between the electronic component and the sidewall of the middle frame 401, to use space between the electronic components and a gap between the electronic component and the sidewall of the middle frame 401, thereby facilitating a miniaturized design of the mobile terminal while improving heat dissipation performance. The thickness of the first vapor chamber 70 may be the same as or different from the thickness of the heat pipe 60. The heat pipe 60 may be manufactured to have an unequal thickness, an unequal width, a bend, a section difference, or the like, which is determined based on a specific use scenario.

In this disclosure, one end of the heat pipe 60 is connected to the first vapor chamber 70, and heat of the heat source 101 may be rapidly dissipated by using a comprehensive heat conduction effect of two-dimensional extended heat conduction of the vapor chamber and one-dimensional linear heat conduction of the heat pipe 60, to prolong a service life of the heat source 101 and reduce a temperature of the heat source, thereby prolonging a service life of the mobile terminal, reducing a temperature of the mobile terminal during use, and improving use experience of a consumer. In addition, the first vapor chamber 70 may be fastened to the middle frame 401. For example, the first vapor chamber 70 may be fixedly connected to the middle frame 401 through welding. The heat of the heat source 101 may be conducted to the entire middle frame 401 by using the first vapor chamber 70, and the heat is conducted out by using the middle frame 401. An area of the middle frame assembly 40 is large, and heat dissipation efficiency is high, thereby improving heat dissipation performance of the entire mobile terminal.

In this disclosure, a manner of fastening the first vapor chamber 70 in the heat dissipation region 402 includes but is not limited to the following two manners.

Manner 1: The heat dissipation region 402 is a hole. In this way, even if the thickness of the first vapor chamber 70 is relatively large, the hole can still accommodate the relatively thick first vapor chamber 70, and the first vapor chamber 70 does not increase a thickness of the middle frame assembly 40. In addition, the hole is disposed to prevent, to the utmost extent, the first vapor chamber 70 from increasing the thickness of the middle frame assembly 40. Moreover, to implement better heat dissipation and fastening, the first vapor chamber 70 may be further fixedly connected to the middle frame 401 by using an overlapping structure. Specifically, the middle frame 401 includes a first overlapping side 401a, and the first overlapping side 401a extends toward the inside of the hole. The first vapor chamber 70 includes a third overlapping side 70a, and the third overlapping side 70a is disposed protruding from a periphery of the first vapor chamber 70. The first overlapping side 401a overlaps the third overlapping side 70a. The first overlapping side 401a and the third overlapping side 70a may be fastened through welding or may be fastened by using an adhesive at a location at which they overlap. In this way, the first vapor chamber 70 is fastened to the middle frame 401 (refer to FIG. 1b). The first vapor chamber is further configured to connect to a heat source to dissipate heat from the heat source. For example, the first vapor chamber is connected to the heat source and dissipate heat by using a heat conducting adhesive.

Manner 2: The heat dissipation region 402 is a groove. To be specific, a part of the middle frame material of a specific thickness is further reserved in the heat dissipation region 402 to bear the first vapor chamber 70. The first vapor chamber 70 is embedded in the groove, and the first vapor chamber 70 may be fastened and adhered to a bottom wall of the groove by using a heat conducting adhesive, that is, the first vapor chamber 70 and the middle frame 401 are fastened by using the heat conducting adhesive. This fastening architecture requires a relatively thick heat conducting adhesive. In another implementation, a relatively thin layer of heat conducting adhesive may be disposed. In addition, an overlapping structure is disposed on the middle frame 401, an overlapping structure is disposed at an edge of the first vapor chamber 70, and the overlapping structure of the middle frame 401 (for details, refer to the overlapping structure in the first fastening manner) cooperates with the overlapping structure of the first vapor chamber to form an overlapping fastening solution. This overlapping fastening solution and the heat conducting adhesive jointly fasten the first vapor chamber 70 to the middle frame 401. In this manner, the first vapor chamber 70 is embedded in the groove, so that the first vapor chamber 70 does not increase a thickness of the middle frame assembly 40, the middle frame assembly 40 may be relatively thin, and the mobile terminal may be relatively thin. It may be understood that the heat dissipation region 402 is further configured to connect to a heat source to dissipate heat from the heat source. For example, the heat dissipation region 402 is connected to the heat source by using a heat conducting adhesive, to first conduct, to the heat dissipation region 402 in the middle frame, heat generated by the heat source, and then the heat is dissipated by using the first vapor chamber fastened in the heat dissipation region 402.

In this disclosure, there is at least one heat pipe 60, and there is at least one first vapor chamber 70. One or more heat pipes 60 or first vapor chambers 70 may be selected based on an actual engineering design requirement (such as an internal space structure layout and a heat dissipation requirement) or the like. For example, in the implementation shown in FIG. 3, there is one heat pipe 60 and one vapor chamber (namely, the first vapor chamber 70). It may be understood that when there are a plurality of heat pipes 60 or a plurality of vapor chambers, a heat dissipation area of the middle frame assembly 40 may be enlarged, and heat dissipation efficiency is high. In one of the following embodiments, one heat pipe 60 and one vapor chamber (the first vapor chamber 70) are described.

A connection relationship between the heat pipe 60 and the first vapor chamber 70 is described below in detail.

Refer to FIG. 3. The middle frame assembly 40 shown in FIG. 3 includes the middle frame 401, one heat pipe 60, and one vapor chamber (the first vapor chamber 70). The heat pipe 60 includes a first section 60a and a second section 60b disposed opposite to the first section 60a. The first section 60a and the second section 60b each refer to a segment of solid region in which the heat pipe 60 extends from an end to a direction opposite to the end. Specifically, in the embodiment shown in FIG. 3, the heat pipe includes two ends. The first section 60a is connected to the first vapor chamber 70. The second section 60b is a free end and may be completely or partially connected to a component (for example, the middle frame, the battery, or another electronic component) that is cold relative to the first vapor chamber. In another embodiment, the heat pipe 60 may have a plurality of branches, and therefore has a plurality of ends. In this case, there may be more sections. Some sections may be connected to the first vapor chamber 70, and the other sections may be connected to a component that is cold relative to the first vapor chamber.

After the heat source 101 runs and generates heat, the heat may be first transferred to the first vapor chamber 70 (assuming that the heat dissipation region 402 is a hole, the first vapor chamber 70 passes through the hole to be connected to the heat source, or the first vapor chamber 70 is accommodated in the hole to be connected to the heat source). The heat on the first vapor chamber 70 may be transferred to the second section 60b along the first section 60a of the heat pipe 60. The second section 60b is relatively far away from the heat source 101, and the second section 60b may rapidly dissipate the heat. Further, the heat of the heat source 101 may be conducted to the entire heat pipe 60, and heat conduction circulation may be completed in the entire heat pipe 60. Therefore, a heat dissipation area is large, and heat dissipation efficiency is high, thereby improving heat dissipation performance of the entire mobile terminal. It may be understood that when the heat source 101 generates a relatively small amount of heat, the heat may be transferred to a specific location between the first section 60a and the second section 60b, to complete one time of heat conduction circulation. In addition, when the first vapor chamber 70 is fastened to the middle frame 401 in some heat conducting manners (such as welding or bonding by using a heat conducting adhesive), the heat on the first vapor chamber 70 may be further transferred to the entire middle frame 401, and the heat is further dissipated by using the middle frame 401.

In another implementation, both the heat pipe 60 and the vapor chamber (such as the first vapor chamber 70) may be fastened to the middle frame 401 (as shown in FIG. 1b). Heat generated by the heat source 101 during running may be first transferred to the first section 60a of the heat pipe 60, and the first section 60a of the heat pipe 60 transfers the heat to the first vapor chamber 70 and transfers the heat to the second section 60b of the heat pipe 60. In another implementation, the heat source 101 may include electronic components of different heights. Therefore, a relatively high electronic component may be directly in contact with the first vapor chamber 70, and a gap may be formed between a relatively small-sized electronic component and the first vapor chamber 70. The heat pipe 60 may be disposed at a location of the gap. Both the first section 60a of the heat pipe 60 and the first vapor chamber 70 may be in contact with the heat source 101, so that the heat generated by the heat source 101 during running may be transferred to both the first section 60a of the heat pipe and the first vapor chamber 70. In this way, the heat pipe 60 may be disposed in relatively small space, to transfer heat to a region in which the mobile terminal generates no heat. In addition, two-dimensional heat conduction of the first vapor chamber 70 may be further used, so that a heat conduction effect is fairly good, and the heat is transferred to a region with a relatively low temperature in the mobile terminal by using the second section 60b of the heat pipe 60.

Figure 4:
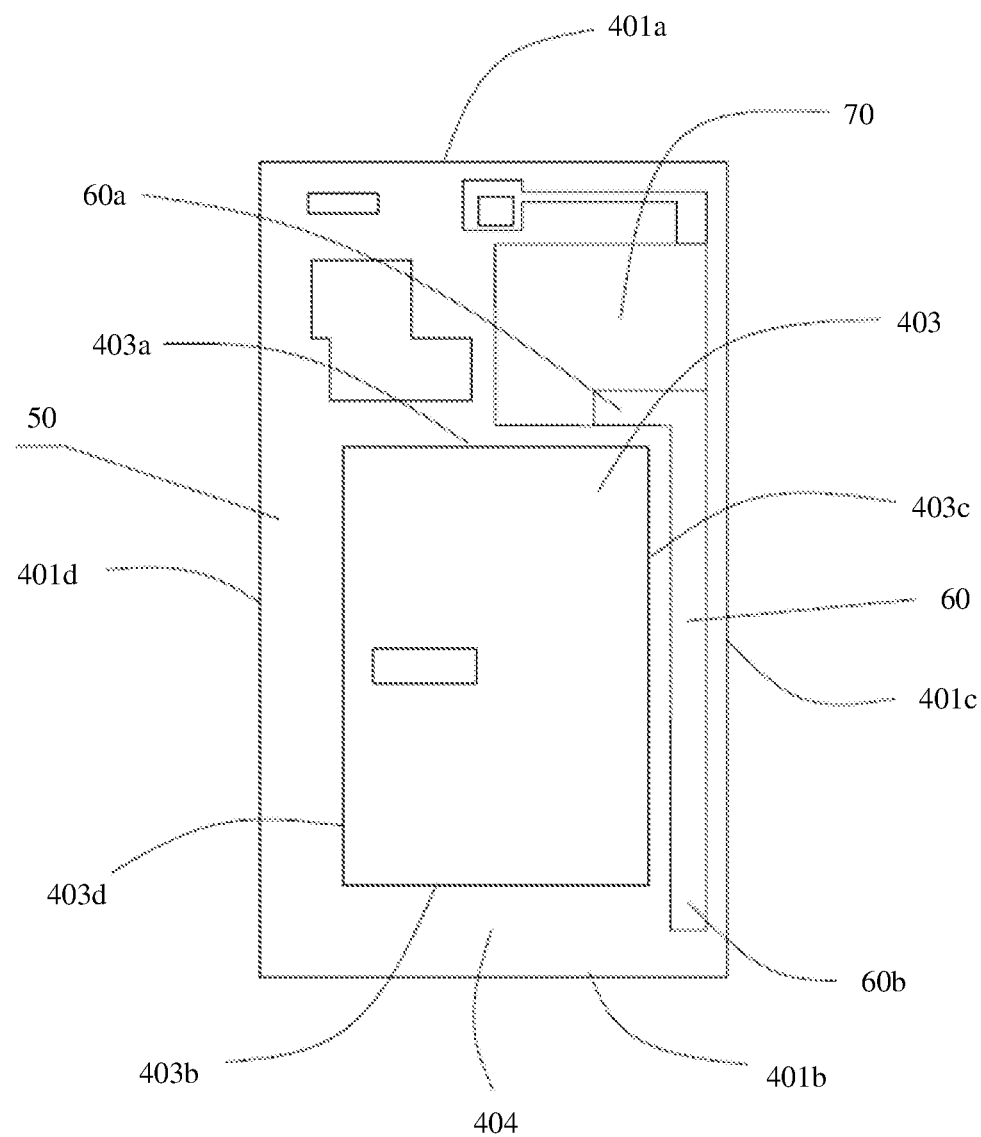
FIG. 4 is a schematic top view of a second structure of a middle frame assembly according to an embodiment of the present invention.

In this disclosure, the heat pipe 60 is combined with the first vapor chamber 70, and the heat is transferred to the region with a relatively low temperature in the mobile terminal by using the second section 60b of the heat pipe, to implement efficient heat dissipation. The heat pipe 60 extends from the heat dissipation region 402 to a direction of the second edge 403b. In other words, the heat pipe 60 extends along a direction from the first edge 403a to the second edge 403b of the battery placement region 403, and the second section 60b of the heat pipe 60 may be located between the first edge 403a and the second edge 403b (as shown in FIG. 3). It may be understood that the second section 60b of the heat pipe 60 may cross the second edge 403b and is located in the another element placement region 404 (as shown in FIG. 4). It may be understood that the gap between the battery placement region 403 and the sidewall 401c of the middle frame 401 and the another element placement region 404 both may be considered as regions with a relatively low temperature, and temperatures in the two places both are lower than a temperature in the heat dissipation region 402.

Still refer to FIG. 3. FIG. 3 shows that the heat pipe 60 extends along a periphery of the battery placement region 403. The periphery of the battery placement region 403 may be a region between the battery placement region 403 and the sidewall of the middle frame 401, or may be a region between the battery placement region 403 and the heat dissipation region 402. When the heat pipe 60 extends along the periphery of the battery placement region 403, the heat pipe 60 does not overlap the battery placement region 403, and does not affect a thickness of the middle frame assembly 40. When the battery is placed in the mobile terminal, the heat pipe 60 is not in contact with the battery, and does not affect a thickness of the mobile terminal.

Specifically, the heat pipe 60 is connected to a part that is in the middle frame 401 and whose temperature is lower than a temperature of the first vapor chamber 70 but is not in contact with the battery. To be specific, when the mobile terminal runs normally, the mobile terminal generates heat. The temperature of the part that is in the middle frame 401 and that is connected to the heat pipe 60 is less than that of the first vapor chamber 70. The part that is in the middle frame 401 and whose temperature is less than that of the first vapor chamber 70 may be a part on a side that is of the middle frame 401 and that is away from the first vapor chamber 70. In other words, the heat pipe 60 is further connected to the side that is of the middle frame 401 and that is away from the first vapor chamber 70. A heat dissipation area of the middle frame 401 is large, and heat dissipation efficiency is high. In addition, when the heat pipe 60 is not in contact with the battery, the heat pipe 60 and the battery do not transfer heat to each other. The heat pipe 60 does not overlap the battery and does not affect the thickness of the mobile terminal. It may be understood that the first vapor chamber 70 is configured to dissipate heat from the heat source 101, for example, dissipate heat from a CPU. A part that is in the middle frame assembly 40 and whose temperature is lower than the temperature of the first vapor chamber 70 may be located in a bottom region of the mobile terminal, or may be located in a region near a boundary of the middle frame assembly 40. An antenna, a key, a speaker, or the like may be placed in these regions. When the mobile terminal runs normally, temperatures in these regions are lower than the temperature of the first vapor chamber 70, and the heat pipe 60 may be connected to these regions or may be connected to components in these regions.

In one embodiment, the gap 50 between the battery placement region 403 and the sidewall 401c of the middle frame 401 is idle space, and a part of the heat pipe 60 may be accommodated in the gap 50 between the battery placement region 403 and the sidewall 401c of the middle frame 401, that is, a part of the heat pipe 60 is accommodated in the idle space. In this way, not only the idle space is used, but also no new space needs to be disposed in the mobile terminal to accommodate the heat pipe 60, so that a volume of the mobile terminal is not increased. In another implementation, a relatively large quantity of gaps are disposed between the battery placement region 403 and the top 401a of the middle frame 401, for example, a gap between electronic components. A part of the heat pipe 60 may be accommodated in the gap between the electronic components and extends in the gap. The gap may be located on a side that is of the middle frame 401 and that corresponds to the main board 10.

Figure 5:
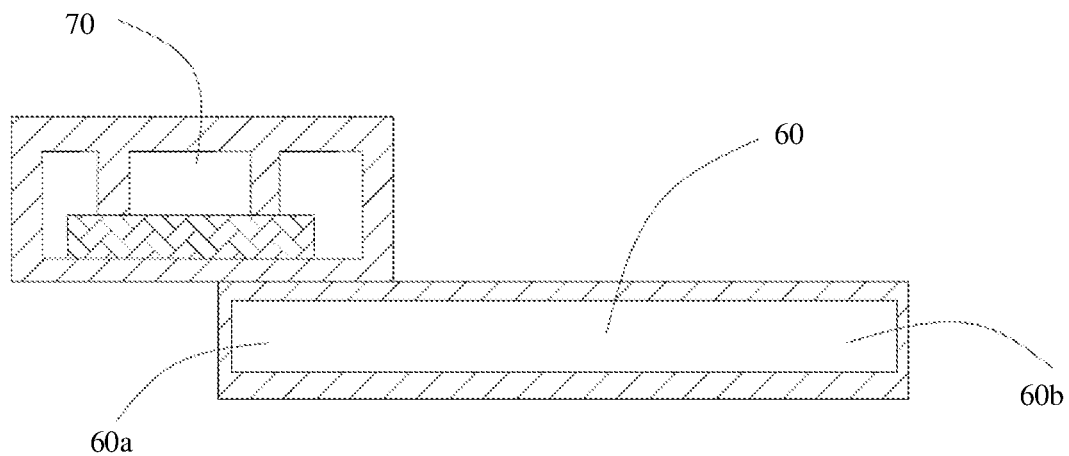
FIG. 5 is a schematic cross-sectional diagram in which a heat pipe overlaps a first vapor chamber.
Figure 6:
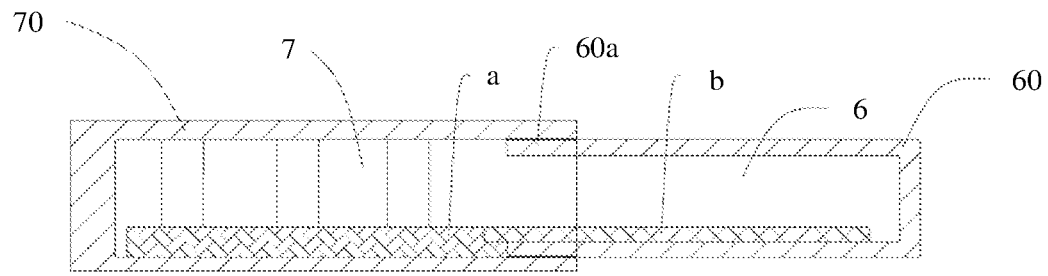
FIG. 6 is a schematic cross-sectional diagram in which a heat pipe is connected to a first vapor chamber.

FIG. 5 and FIG. 6 show connection relationships between the heat pipe 60 and the first vapor chamber 70. The connection relationships between the heat pipe 60 and the first vapor chamber 70 include but are not limited to the following three types.

Type 1: As shown in FIG. 5, the heat pipe 60 overlaps the first vapor chamber 70 in a direction perpendicular to a chamber surface of the first vapor chamber 70. Specifically, the first section 60a overlaps the first vapor chamber 70 in the direction perpendicular to the first vapor chamber 70, to be specific, the first section 60a is located outside the first vapor chamber 70 and partially overlaps the first vapor chamber 70. The first section 60a may be connected to the first vapor chamber 70 by using a heat conducting adhesive, to improve heat conduction performance. Through overlapping between the heat pipe 60 and the first vapor chamber 70, heat transferred from the heat source 101 to the first vapor chamber 70 may be transferred to the heat pipe 60 through heat conduction, so that not only heat can be transferred rapidly, but also a manner of connecting the heat pipe 60 and the first vapor chamber 70 is simple and easy to operate. In a specific implementation, same working fluid may be disposed in the heat pipe 60 and the first vapor chamber 70. Certainly, different working fluid may be disposed in the heat pipe 60 and the first vapor chamber 70. For example, first working fluid may be disposed in the heat pipe 60, and second working fluid may be disposed in the first vapor chamber 70, where the first working fluid is different from the second working fluid. For example, the first working fluid may be methanol, R134A, acetone, or the like, and the second working fluid may be water or the like. The heat pipe 60 and the first vapor chamber 70 may be connected by using a heat conducting medium. The heat conducting medium may be a heat conducting adhesive or a graphite material. Heat conductivity of the heat conducting adhesive may be more than 1 W/m.K. The heat conductivity of the heat conducting adhesive is twice over heat conductivity of an ordinary adhesive layer, and the heat conducting adhesive has good heat conduction performance.

Type 2: As shown in FIG. 6, the heat pipe 60 is connected to the first vapor chamber 70. Specifically, a first cavity 7 is disposed in the first vapor chamber 70, a second cavity 6 is disposed in the heat pipe 60, and the first section 60a extends into the first vapor chamber 70. A hole may be dug on the first vapor chamber 70, and the first section 60a of the heat pipe 60 extends into the hole and is fastened through welding and sealing. In the solution in which the first section 60a extends into the first vapor chamber 70, internal space of the first vapor chamber 70 may be connected to internal space of the heat pipe 60, to form a relatively large and complete heat conducting cavity. As shown in FIG. 6, a relatively large and complete heat conducting cavity is formed inside after the heat pipe and the first vapor chamber are connected. A capillary structure a in the first vapor chamber 70 is connected to a capillary structure b in the heat pipe 60, and working fluid in the heat conducting cavity passes through a longer path and takes longer time to complete one time of heat conduction circulation, so that heat of the heat source can be transferred to a larger region of the middle frame, and the heat is conducted out more dispersedly, and therefore heat dissipation efficiency is high. It may be understood that a state in which the first vapor chamber 70 is connected to the heat pipe 60 is equivalent to extending a conduction path of a heat conducting medium in the heat conducting cavity, and a temperature may be equalized between a region in which heat sources are centralized and a region with a relatively low temperature in the terminal. This architecture has a better temperature equalization effect.

Type 3: The first section 60a is connected to a side of the first vapor chamber 70. The first vapor chamber 70 and the first section 60a may be fastened through welding by using another connecting piece, or the first section 60a may be fixedly connected to an overlapping side disposed at an outer edge of the first vapor chamber 70.

Figure 7:
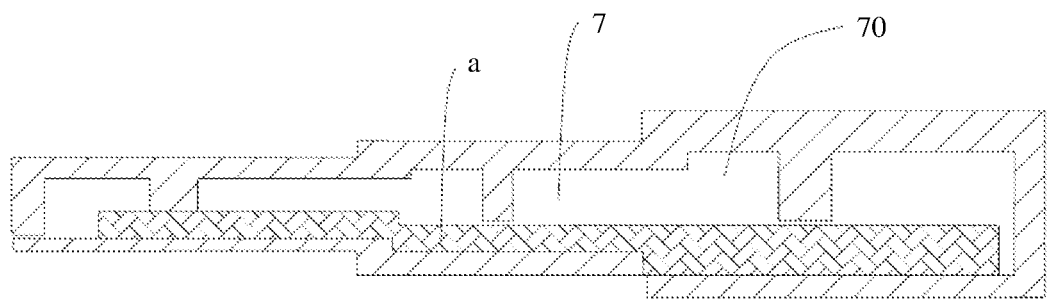
FIG. 7 is a schematic cross-sectional diagram in which a thickness of a first vapor chamber is increased step by step.

In this disclosure, electronic components in the mobile terminal may have different heights. For example, components forming the heat source 101 have different heights, so that a partial region of the middle frame 401 is relatively thick and a partial region of the middle frame 401 is relatively thin. Therefore, a thickness of the vapor chamber in this disclosure may also be uneven. For example, refer to FIG. 7. The first vapor chamber 70 includes three parts of different thicknesses. The first cavity 7 in the first vapor chamber 70 is also distributed with different volumes. The capillary structure a is disposed in the first cavity 7, and the capillary structure a is distributed in a step shape. A plurality of support posts are further distributed in the first cavity 7 of the first vapor chamber 70, which are configured to support the first cavity 7, to prevent the first vapor chamber 70 from being deformed, thereby reducing internal space of the first cavity. In this implementation, a thickness of the first vapor chamber 70 is increased step by step, which may be applied to an electronic component whose height is decreased step by step. This further enables a volume of a flow equalization cavity inside the first vapor chamber 70 to gradually increase, and enables a flowing range of working fluid to be larger, so that a heat dissipation effect is better. It may be understood that, the thickness of the first vapor chamber 70 may be uneven in another manner. For example, the thickness of the first vapor chamber 70 is evenly alternating between high and low or unevenly alternating between high and low, to correspond to electronic components of different heights; or the thickness of the first vapor chamber 70 may be linearly decreased or linearly increased. The thickness of the first vapor chamber 70 in this disclosure is determined based on a height of an electronic component in a specific use environment.

In this disclosure, two-phase components (the heat pipe 60 and the vapor chamber) of different thicknesses may be used in different regions, and two-phase components (the heat pipe 60 and the vapor chamber) of different widths may be used in different regions, to flexibly arrange the two-phase components (the heat pipe 60 and the vapor chamber) on the middle frame 401 of the mobile terminal.

Figure 8:
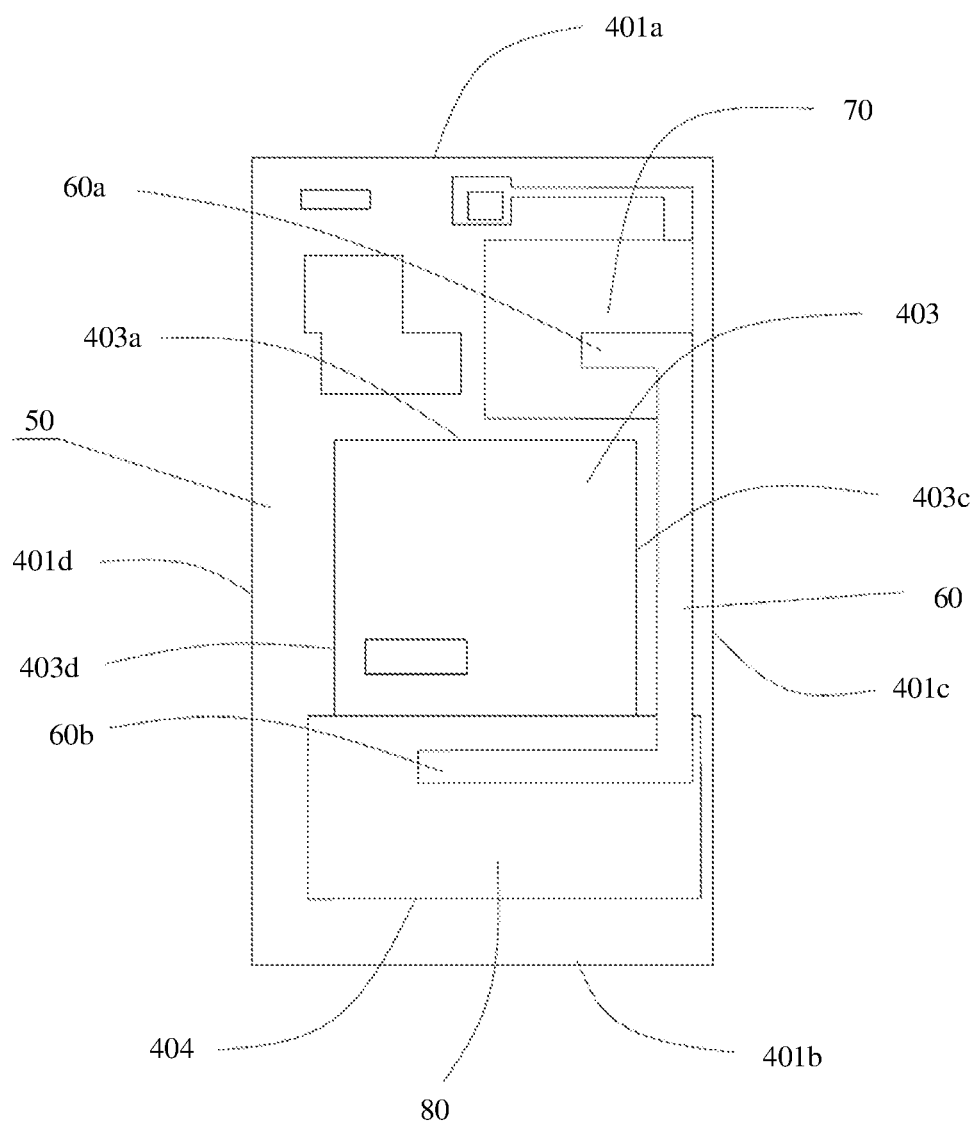
FIG. 8 is a schematic top view of a third structure of a middle frame according to an embodiment of the present invention.

FIG. 8 is another schematic top view of a structure of the middle frame assembly 40, and the figure shows that the middle frame assembly 40 includes one heat pipe 60 and two vapor chambers (the first vapor chamber 70 and a second vapor chamber 80). The second vapor chamber 80 is fastened in the another element placement region 404, and the heat pipe 60 is connected to the first vapor chamber 70 and the second vapor chamber 80. In this embodiment, the first section 60a of the heat pipe 60 is fixedly connected to the first vapor chamber 70, and the second section 60b of the heat pipe 60 is fixedly connected to the second vapor chamber 80. To be specific, when the heat source is fixedly placed in the heat dissipation region 402, and another heat source is fixedly placed in the another element placement region 404, heat of the heat source may be conducted to the first vapor chamber 70 and conducted to the heat pipe 60, and heat of the another heat source may be conducted to the second vapor chamber 80 and conducted to the heat pipe 60. Further, the heat of the heat source and the another heat source may be rapidly dissipated under comprehensive action of the first vapor chamber 70, the second vapor chamber 80, and the heat pipe 60, thereby prolonging a service life of the mobile terminal and improving use experience of a consumer.

Figure 9:
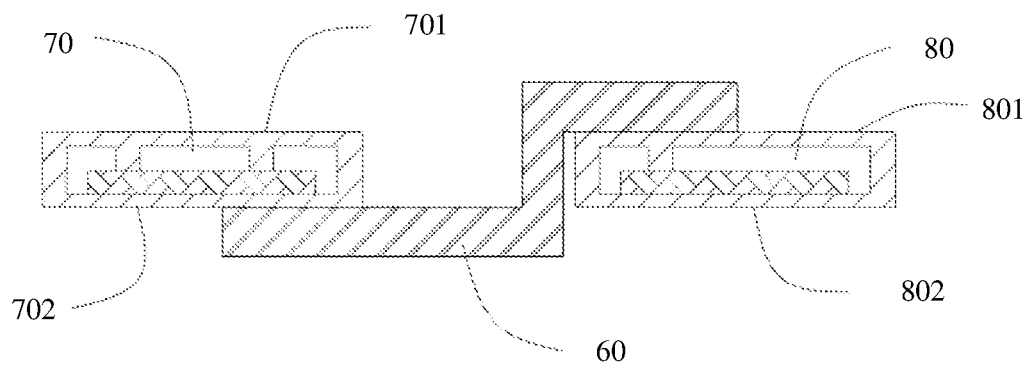
FIG. 9 is a schematic cross-sectional diagram in which a heat pipe overlaps a first vapor chamber and a second vapor chamber.

FIG. 9 shows a manner of connecting the heat pipe 60 to the first vapor chamber 70 and overlapping the heat pipe 60 with the second vapor chamber 80. The first vapor chamber 70 includes a first top surface 701 and a first bottom surface 702 disposed opposite to the first top surface 701, and the second vapor chamber 80 includes a second top surface 801 and a second bottom surface 802 disposed opposite to the second top surface 801. A manner of connecting the heat pipe 60 to the first vapor chamber 70 and the second vapor chamber 80 includes but is not limited to the following four manners: The heat pipe 60 is connected to the first top surface 701 and the second top surface 801. The heat pipe 60 is bent to be connected to the first top surface 701 and the second bottom surface 802. The heat pipe 60 is bent to be connected to the first bottom surface 702 and the second top surface 801 (FIG. 9). The heat pipe 60 is connected to the first bottom surface 702 and the second bottom surface 802. All the foregoing four manners of connecting the heat pipe 60 to the first vapor chamber 70 and the second vapor chamber 80 can be used to conduct heat of the heat source 101 and another heat source 102 to the first vapor chamber 70, the second vapor chamber 80, and the heat pipe 60, and conduct the heat to the entire middle frame 401. A specific manner to be selected is determined based on an actual use requirement. Working fluid in the heat pipe 60, the first vapor chamber 70, and the second vapor chamber 80 may be the same or may be different. For example, first working fluid is disposed in the heat pipe 60, second working fluid is disposed in the first vapor chamber 70, and third working fluid is disposed in the second vapor chamber 80. At least one of the first working fluid, the second working fluid, and the third working fluid is different from remaining working fluid, and the first working fluid, the second working fluid, and the third working fluid may be one, two, or three of methanol, R134A, acetone, or water.

Figure 10:
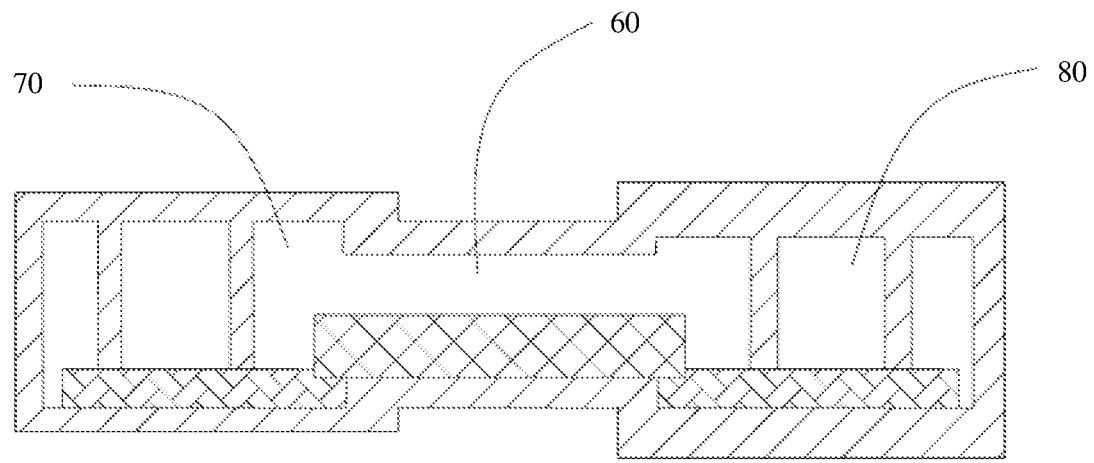
FIG. 10 is a schematic cross-sectional diagram in which a heat pipe is connected to a first vapor chamber and a second vapor chamber.

FIG. 10 shows a manner of connecting the heat pipe 60 to the first vapor chamber 70 and the second vapor chamber 80. Internal space of the heat pipe 60, internal space of the first vapor chamber 70, and internal space of the second vapor chamber 80 jointly form a heat conducting cavity. Specifically, the heat pipe 60 may be connected to one of the first vapor chamber 70 and the second vapor chamber 80, or the heat pipe 60 is connected to both the first vapor chamber 70 and the second vapor chamber 80. A connection manner is the same as the foregoing manner of connecting the heat pipe 60 to the first vapor chamber 70, and details are not described herein again in this disclosure. A larger and complete heat conducting cavity is formed inside after the heat pipe 60, the first vapor chamber 70, and the second vapor chamber 80 are connected. Working fluid in the heat conducting cavity passes through a longer path and takes longer time to complete one time of heat conduction circulation, so that heat of the heat source may be transferred to a larger region of the middle frame 401, and the heat is conducted out more dispersedly, and therefore heat dissipation efficiency is high.

A manner of fastening the second vapor chamber 80 to the middle frame 401 in the another element placement region 404 may be the same as a manner of fastening the first vapor chamber to the middle frame 401 in the heat dissipation region 402. The middle frame 401 may be provided with a first groove, a second groove, and a third groove. The first groove is disposed in the heat dissipation region 402, the second groove is disposed in the another element placement region 404, the first vapor chamber 70 is embedded in the first groove, the second vapor chamber 80 is embedded in the second groove, and the heat pipe 60 is disposed in the third groove. In this manner, the vapor chamber and the heat pipe are embedded in the grooves, so that the first vapor chamber 70, the second vapor chamber 80, and the heat pipe 60 do not increase a thickness of the middle frame 401, and the mobile terminal may be relatively thin. It may be understood that the first groove, the second groove, and the third groove may be simultaneously disposed in one implementation. In another implementation, one or two of the three grooves may be selectively configured based on a specific structure in the mobile terminal. For example, in some places, a gap exists between electronic components and can be used for placing the heat pipe. In this case, the third groove does not need to be disposed.

Certainly, it may be understood that the middle frame 401 is provided with the first groove and the third groove, and the third groove is formed at the bottom of the first groove. The first vapor chamber 70 is embedded in the first groove, the heat pipe 60 is partially embedded in the third groove, and a part of the heat pipe 60 in the groove is stacked with the first vapor chamber 70. In this implementation, a part of the heat pipe 60 is located between the first vapor chamber 70 and the heat source 101, openings of the first groove and the third groove face a side that is of the middle frame 401 and that is away from the heat source 101, the heat source 101 is spaced from the heat pipe 60 and the first vapor chamber 70 by the middle frame 401, and the middle frame 401 is configured to support the heat source 101. In this way, the heat of the heat source 101 is first transferred to the middle frame 401 opposite to the heat source 101 and is then transferred to other parts of the first vapor chamber 70, the heat pipe 60, and the middle frame 401, so that heat of the mobile terminal can be rapidly dissipated.

In some other embodiments, a "hole" may be used to replace one or more of the "grooves", that is, the first groove, the second groove, and the third groove each may be in a form of the "hole". Alternatively, in the three grooves, some may be designed as grooves, and some may be designed as architectures of holes.

Figure 11:
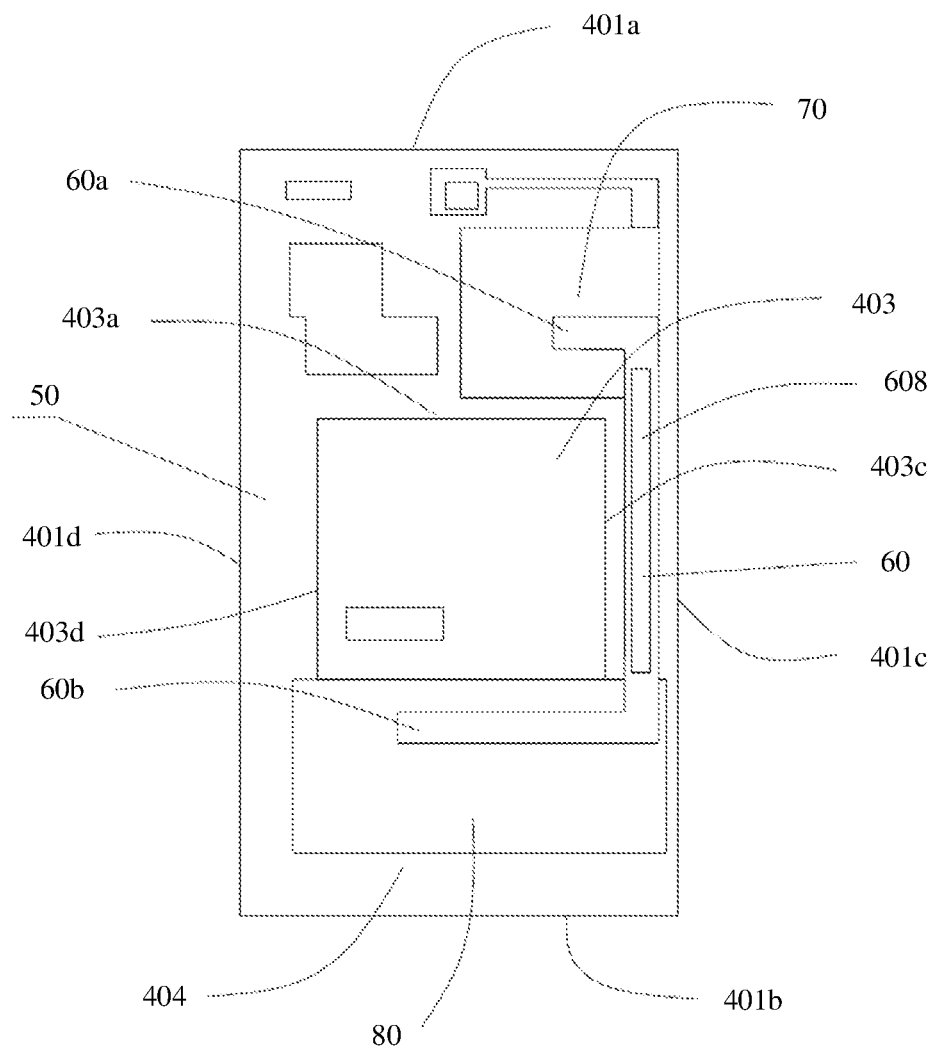
FIG. 11 is a schematic top view of a fourth structure of a middle frame assembly according to an embodiment of the present invention.

Refer to FIG. 11. A wire groove 608 is disposed on an outer surface of the heat pipe 60. The wire groove 608 is configured to fasten a conducting wire in the mobile terminal, and the conducting wire is configured to electrically connect an electronic component in the heat dissipation region 402 and an electronic component in the another element placement region. Specifically, for example, the heat source may be a plurality of high-power components such as a CPU or a GPU, and the another heat source may be a heat source such as sound on display and a screen driver. The foregoing heat source needs to be connected to the another heat source by using a conducting wire. The wire groove 608 on the surface of the heat pipe 60 may be used as a carrier of the conducting wire, so that the conducting wire may be fastened in the wire groove 608 of the heat pipe 60, to fasten a location of the conducting wire, thereby avoiding damage caused to the conducting wire due to shaking, and prolonging a service life of the mobile terminal. A specific manner of disposing the wire groove 608 on the surface of the heat pipe 60 may be as follows: A groove is formed on the outer surface of the heat pipe 60 through processing by a machine; or a structure, such as a hook similar to a wire bundle, used to fasten a conducting wire is welded on the outer surface of the heat pipe 60, and the wire groove 608 may be formed in the hook.

In a specific embodiment, a heat conducting film is disposed on outer surfaces of the heat pipe 60 and the vapor chambers (the first vapor chamber 70 and the second vapor chamber 80). A material of the heat conducting film may be graphene. The heat conducting film is disposed, so that heat on the heat pipe and the vapor chamber is conducted to the outside more rapidly.

A specific implementation in which the middle frame assembly 40 includes two heat pipes 60 and one vapor chamber (the first vapor chamber 70) is described below.

Figure 12:
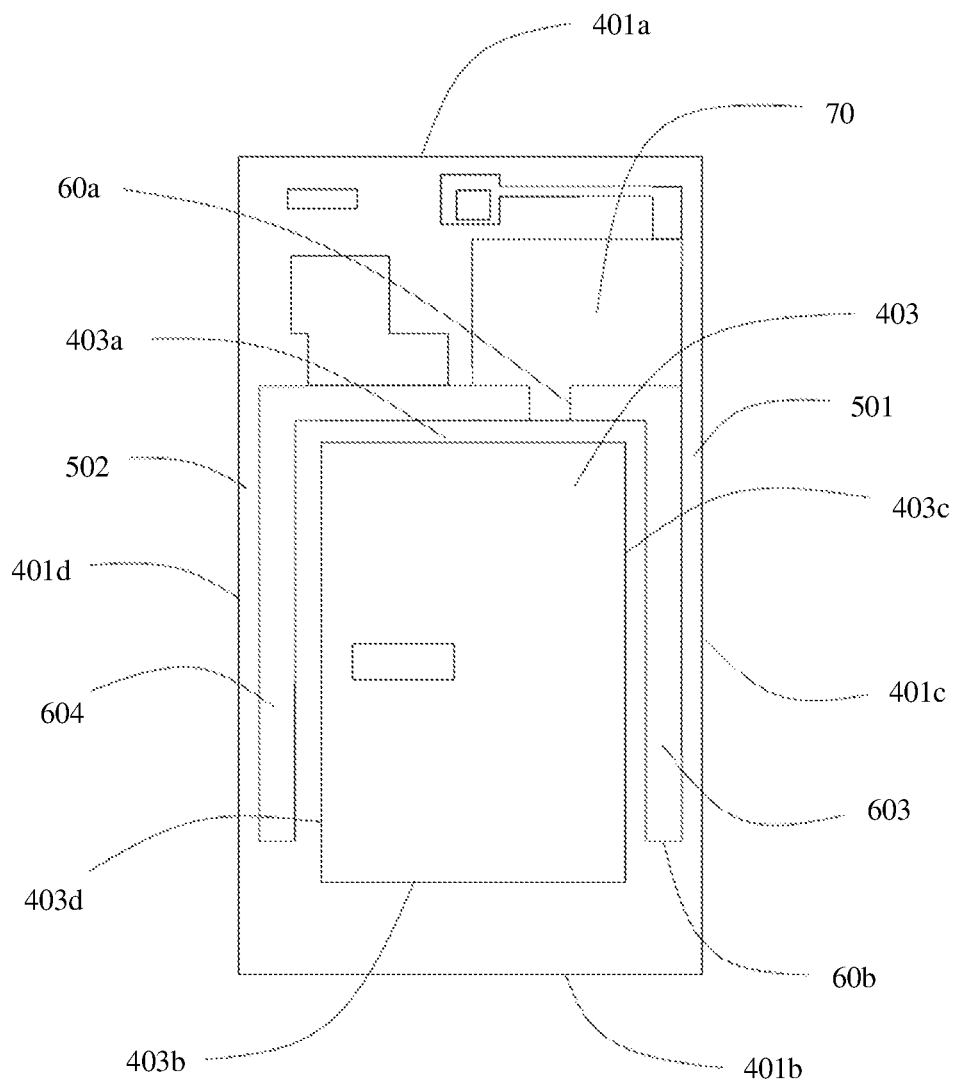
FIG. 12 is a schematic top view of a fifth structure of a middle frame assembly according to an embodiment of the present invention.

FIG. 12 is another schematic top view of a structure of the middle frame assembly 40. In this embodiment, the heat pipe 60 includes at least a first heat pipe 603 and a second heat pipe 604 that are disposed at intervals, and both the first heat pipe 603 and the second heat pipe 604 are disposed around the battery placement region 403. Disposing of the two heat pipes 60 achieves a good heat dissipation effect, and heat of the heat source can be dissipated more rapidly, to prolong a service life of the heat source, thereby prolonging a service life of the mobile terminal and improving use experience of a consumer. In addition, when both the first heat pipe 603 and the second heat pipe 604 are disposed around the battery placement region 403, a gap between the battery placement region 403 and each of the third sidewall 401*c* and the fourth sidewall 401*d* is used, and neither of the two heat pipes 60 overlaps the battery placement region 403 and affects a thickness of the middle frame 401. When the battery is placed in the mobile terminal, the heat pipe 60 does not overlap the battery, and does not affect the thickness of the mobile terminal.

In a specific implementation, the first section 60*a* of the first heat pipe 603 is accommodated between the top 401*a* and the battery placement region 403 and is near the third edge 403*c*. The second section 60*b* of the first heat pipe 603 extends to the first gap 501 between the third edge 403*c* and the third sidewall 401*c*. A part of the second heat pipe 604 is accommodated between the top 401*a* and the battery placement region 403 and is near the fourth edge 403*d*. A part of the second heat pipe 604 extends to the second gap 502 between the fourth edge 403*d* and the fourth sidewall 401*d*.

Figure 13:
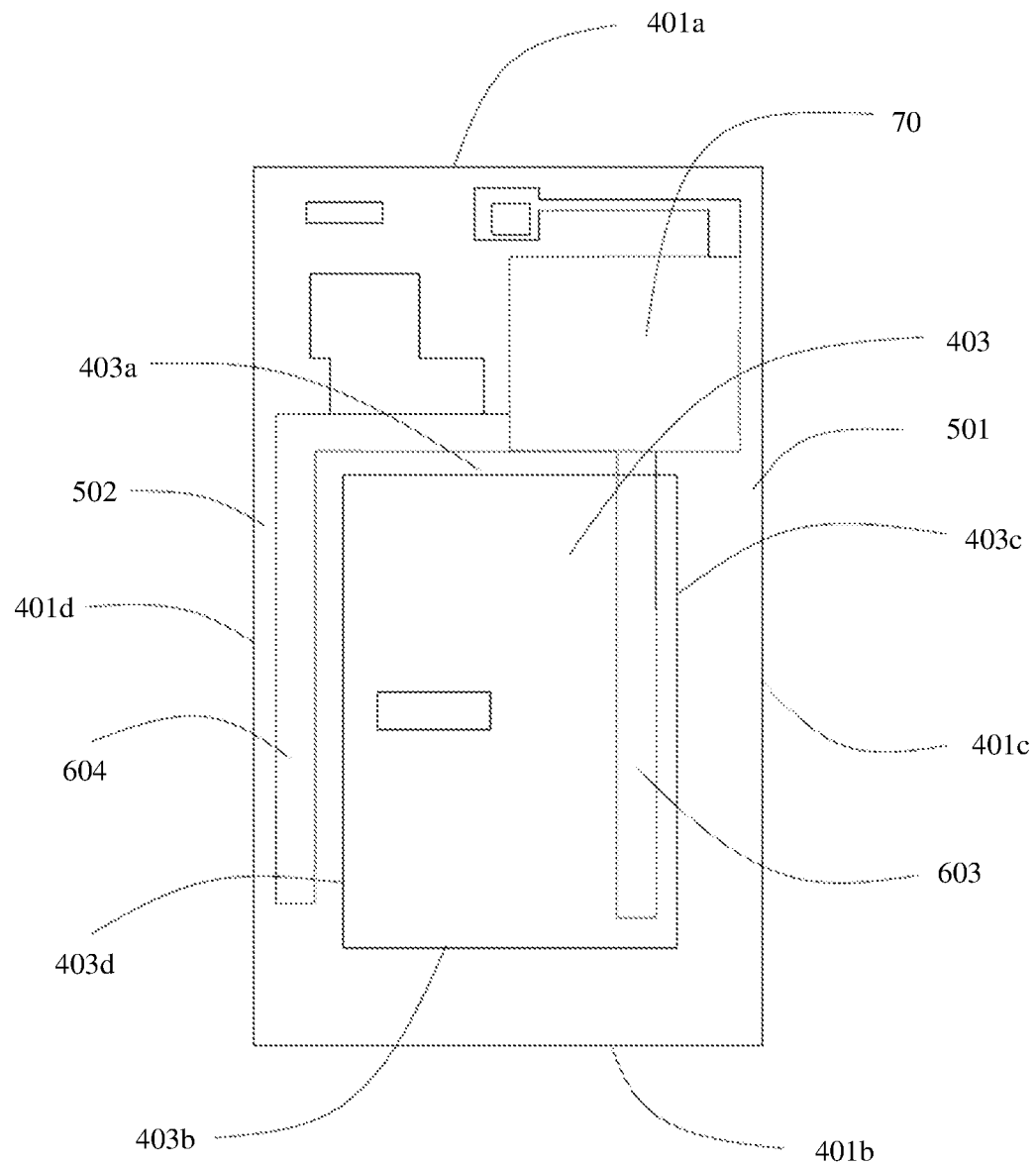
FIG. 13 is a schematic top view of a sixth structure of a middle frame assembly according to an embodiment of the present invention.

FIG. 13 is another schematic top view of a structure of the middle frame 401. There are still two heat pipes 60 shown in the figure. The second heat pipe 604 surrounds the battery placement region 403, and the first heat pipe 603 overlaps the battery placement region 403. When space between the battery placement region 403 and the sidewall 401*c* of the middle frame 401 is insufficient to accommodate the two heat pipes 60, one of the heat pipes 60 may overlap the battery placement region 403. In this way, heat dissipation effects of the two heat pipes 60 can be used, and the middle frame 401 has a larger region for heat dissipation, so that a heat dissipation effect is better, and heat of the heat source can be dissipated more rapidly, to prolong a service life of the heat source, thereby prolonging a service life of the mobile terminal and improving use experience of a consumer. In addition, space between the battery placement region 403 and each of the third sidewall 401*c* and the fourth sidewall 401*d* of the middle frame 401 and other space can also be effectively used. Moreover, the manner in which the first heat pipe 603 overlaps the battery placement region 403 facilitates installation of the first heat pipe 603 and is convenient for operation, and the first heat pipe 603 may be configured to dissipate heat of the battery.

Specifically, when the first heat pipe 603 overlaps the battery placement region 403, the first heat pipe 603 is connected to a surface of the battery, so that heat on the battery may be further transferred to the first heat pipe 603 and is then transferred to the entire middle frame 401. In this way, the middle frame 401 dissipates the heat from the battery. A heat dissipation area is large, and a heat dissipation effect is fairly good.

In another embodiment, the middle frame assembly 40 may include two heat pipes 60 and two vapor chambers, such as the first heat pipe 603, the second heat pipe 604, the first vapor chamber 70, and the second vapor chamber 80. The first vapor chamber 70 is fastened in the heat dissipation region 402, the second vapor chamber 80 is fastened in the another element placement region 404, and both the first heat pipe 603 and the second heat pipe 604 surround the battery placement region 403. The first section 60*a* of the first heat pipe 603 is connected to the first vapor chamber 70, the second section 60*b* of the first heat pipe 603 is connected to the second vapor chamber 80, the first section 60*a* of the second heat pipe 604 is connected to the first vapor chamber 70, and the second section 60*b* of the second heat pipe 604 is connected to the second vapor chamber 80.

Certainly, in another implementation, there may be more heat pipes 60 and vapor chambers, such as a third vapor chamber and a third heat pipe 60. More vapor chambers are connected to more heat pipe 60 to implement heat dissipation in a larger area.

At least one of the one or more heat pipes 60 provided in this disclosure extends between electronic components, and/or at least one of the one or more heat pipes 60 extends between the electronic component and a boundary of the middle frame 401. The electronic component may be a backlight module, a battery, a CPU, a camera, a key, a speaker, or the like in a terminal. As shown in FIG. 13, the first heat pipe 603 extending between electronic components may be understood as the first heat pipe 603 extending between the battery and the backlight module stacked with the battery. The second heat pipe 604 extending between the electronic component and the boundary of the middle frame may be understood as that the second heat pipe 604 extending between the battery and the boundary of the middle frame. According to the middle frame assembly 40 and the mobile terminal in this disclosure, a comprehensive heat conduction effect of the heat pipe 60 and the vapor chamber is used, thereby improving a heat dissipation effect and improving use experience of a consumer.

What are disclosed above are merely example embodiments of this disclosure, and certainly are not intended to limit the protection scope of this application. A person of ordinary skill in the art may understand that all or some of processes that implement the foregoing embodiments and equivalent modifications made in accordance with the claims of the present invention shall fall within the scope of this disclosure.

What is claimed is:

1. A mobile terminal comprising a mainboard, a heat source and a middle frame assembly, wherein:
   the mainboard is installed on the middle frame assembly, and the heat source is disposed on the mainboard;
   the middle frame assembly comprises a middle frame, one or more heat pipes, and a first vapor chamber;
   the middle frame comprises a heat dissipation region corresponding to the heat source, and the first vapor chamber is accommodated in the heat dissipation region and is configured to dissipate heat from the heat source;
   the one or more heat pipes are connected to the first vapor chamber and are configured to dissipate heat from the first vapor chamber;
   the mobile terminal includes electronic components and an internal conducting wire; and
   a wire groove is disposed on an outer surface of at least one of the one or more heat pipes, the wire groove is configured to fasten the internal conducting wire, and the conducting wire is configured to electrically connect the electronic components.

2. The mobile terminal according to claim 1, wherein at least one of the one or more heat pipes is further connected to a part that is in the middle frame and whose temperature is lower than a temperature of the first vapor chamber.

3. The mobile terminal according to claim 2, wherein at least one of the one or more heat pipes is connected to the middle frame by using a heat conducting medium.

4. The mobile terminal according to claim 1, wherein the one or more heat pipes are connected to the first vapor chamber by using a heat conducting medium.

5. The mobile terminal according to claim 1, wherein an internal space of at least one of the one or more heat pipes is connected to an internal space of the first vapor chamber to form a heat conducting cavity.

6. The mobile terminal according to claim 5, wherein one end of at least one of the one or more heat pipes is inserted into the first vapor chamber.

7. The mobile terminal according to claim 1, wherein the mobile terminal further comprises a battery, the middle frame further comprises a battery placement region corresponding to the battery, the battery placement region comprises a first edge and a second edge that are disposed opposite to each other, the heat dissipation region is adjacent to the first edge, and at least one of the one or more heat pipes extends from the heat dissipation region to a direction of the second edge.

8. The mobile terminal according to claim 7, wherein at least one of the one or more heat pipes is not in contact with the battery.

9. The mobile terminal according to claim 8, wherein the middle frame comprises a top, a bottom disposed opposite to the top, and two sidewalls located between the top and the bottom, a gap is formed between the battery placement region and the side walls, and at least one of the one or more heat pipes extends into the gap.

10. The mobile terminal according to claim 7, wherein at least one of the one or more heat pipes is in contact with a surface of the battery.

11. The mobile terminal according to claim 7, wherein the one or more heat pipes comprise a first heat pipe and a second heat pipe that are disposed at intervals, the first heat pipe surrounds the battery placement region, and the second heat pipe overlaps the battery placement region.

12. The mobile terminal according to claim 7, wherein the middle frame comprises a top, a bottom disposed opposite to the top, and two sidewalls located between the top and the bottom, the heat dissipation region is located between the first edge of the battery placement region and the top, another element placement region is disposed between the second edge of the battery placement region and the bottom, the middle frame further comprises a second vapor chamber, the second vapor chamber is fastened in the another element placement region, and at least one of the one or more heat pipes is further connected to the second vapor chamber.

13. The mobile terminal according to claim 12, wherein the middle frame is provided with a first removed region, a second removed region, and a third removed region; the first vapor chamber is embedded in the first removed region, the second vapor chamber is embedded in the second removed region, and at least one of the one or more heat pipes is embedded in the third removed region; and the first removed region is a first groove or a hole, the second removed region is a second groove or a hole, and the third removed region is a third groove or a hole.

14. The mobile terminal according to claim 13, wherein one end of at least one of the one or more heat pipes overlaps the first vapor chamber, and the other end of the at least one of the one or more heat pipes overlaps the second vapor chamber.

15. The mobile terminal according to claim 1, wherein the middle frame is provided with a groove, the middle frame comprises a first overlapping side extending toward the inside of the groove, the first vapor chamber comprises another overlapping side, and the first overlapping side is fastened to the another overlapping side, so that the first vapor chamber is fastened to the middle frame.

16. The mobile terminal according to claim 15, wherein the first overlapping side and the another overlapping side are fastened through welding.

17. The mobile terminal according to claim 1, wherein the middle frame is provided with a groove, the first vapor chamber is accommodated in the groove, and the first vapor chamber is fastened to a bottom of the groove by using a heat conducting adhesive.

18. The mobile terminal according to claim 17, wherein the middle frame comprises a first overlapping side extending toward the inside of the groove, the first vapor chamber comprises a another overlapping side, and the first overlapping side is fastened to the another overlapping side.

19. The mobile terminal according to claim 1, wherein the middle frame is provided with a first removed region and another removed region, the another removed region is formed at the bottom of the first removed region, the first vapor chamber is embedded in the first removed region, at least one of the one or more heat pipes is partially embedded in the another removed region, a part of the at least one of the one or more heat pipes in the another removed region is stacked with the first vapor chamber, the first removed region is a groove or a hole, and the another removed region is a groove or a hole.

20. The mobile terminal according to claim 1, wherein:
at least one of the one or more heat pipes extends between at least two of the electronic components, and/or at least one of the one or more heat pipes extends between at least one of the one or more electronic components and a boundary of the middle frame.

21. A middle frame assembly, configured to bear an electronic components in a mobile terminal, wherein the electronic components comprises a heat source, the middle frame assembly comprising: a middle frame, one or more heat pipes, and a vapor chamber;
the middle frame comprises a heat dissipation region corresponding to the heat source, and the vapor chamber is accommodated in the heat dissipation region and is configured to dissipate heat from the heat source;
the one or more heat pipes are connected to the vapor chamber and are configured to dissipate heat from the vapor chamber;
the mobile terminal includes the electronic components and an internal conducting wire; and
a wire groove is disposed on an outer surface of at least one of the one or more heat pipes, the wire groove is configured to fasten the internal conducting wire, and the conducting wire is configured to electrically connect the electronic components.

22. The middle frame assembly according to claim 21, wherein at least one of the one or more heat pipes is further connected to a part that is in the middle frame and whose temperature is lower than a temperature of the vapor chamber.

23. The middle frame assembly according to claim 22, wherein at least one of the one or more heat pipes is connected to the middle frame by using a heat conducting medium.

24. The middle frame assembly according to claim 21, wherein the one or more heat pipes are connected to the vapor chamber by using a heat conducting medium.

25. A mobile terminal comprising a mainboard, a heat source and a middle frame assembly, wherein:
the mainboard is installed on the middle frame assembly, and the heat source is disposed on the mainboard;
the middle frame assembly comprises a middle frame, one or more heat pipes, and a first vapor chamber;
the middle frame comprises a heat dissipation region corresponding to the heat source, and the first vapor chamber is accommodated in the heat dissipation region and is configured to dissipate heat from the heat source;
the one or more heat pipes are connected to the first vapor chamber and are configured to dissipate heat from the first vapor chamber;
wherein the mobile terminal further comprises a battery, the middle frame further comprises a battery placement region corresponding to the battery, the battery placement region comprises a first edge and a second edge that are disposed opposite to each other, the heat dissipation region is adjacent to the first edge, and at least one of the one or more heat pipes extends from the heat dissipation region to a direction of the second edge;
the middle frame comprises a top, a bottom disposed opposite to the top, and two sidewalls located between the top and the bottom, the heat dissipation region is located between the first edge of the battery placement region and the top, another element placement region is disposed between the second edge of the battery placement region and the bottom, the middle frame further comprises a second vapor chamber, the second vapor chamber is fastened in the another element placement region, and at least one of the one or more heat pipes is further connected to the second vapor chamber; and
the middle frame is provided with a first removed region, a second removed region, and a third removed region; the first vapor chamber is embedded in the first removed region, the second vapor chamber is embedded in the second removed region, and at least one of the one or more heat pipes is embedded in the third removed region; and the first removed region is a first groove or a hole, the second removed region is a second groove or a hole, and the third removed region is a third groove or a hole.

* * * * *